United States Patent [19]

Blankenship

[11] 4,173,305
[45] Nov. 6, 1979

[54] SYSTEM FOR DELIVERING MATERIALS TO DEPOSITION SITE ON OPTICAL WAVEGUIDE BLANK

[75] Inventor: Michael G. Blankenship, Corning, N.Y.

[73] Assignee: Corning Glass Works, Corning, N.Y.

[21] Appl. No.: 885,215

[22] Filed: Mar. 10, 1978

[51] Int. Cl.² .............................................. B05B 1/24
[52] U.S. Cl. ...................................... 239/79; 239/428
[58] Field of Search ................... 239/79, 80, 61, 307, 239/428; 65/3 A, 18, 21, 33; 358/96, 31

[56] References Cited

U.S. PATENT DOCUMENTS

| | | | |
|---|---|---|---|
| 3,421,694 | 1/1969 | Maller | 239/428 |
| 3,883,336 | 5/1975 | Randall | 65/18 |
| 4,062,665 | 12/1977 | Izawa et al. | 65/18 |

Primary Examiner—James B. Marbert
Attorney, Agent, or Firm—Walter S. Zebrowski; Frederick W. Powers, III

[57] ABSTRACT

A system for delivering a siliceous matrix material and selected dopants to an oxidizing reaction flame or the like. Each constituent is maintained in liquified form and transferred by means of an individually controlled metering pump to a nebulizing stage then passed to a burner or the like from which the materials are converted into appropriate soots. The soots are then applied to a starting member which is subsequently subjected to heat to fuse it into a drawing blank.

13 Claims, 1 Drawing Figure

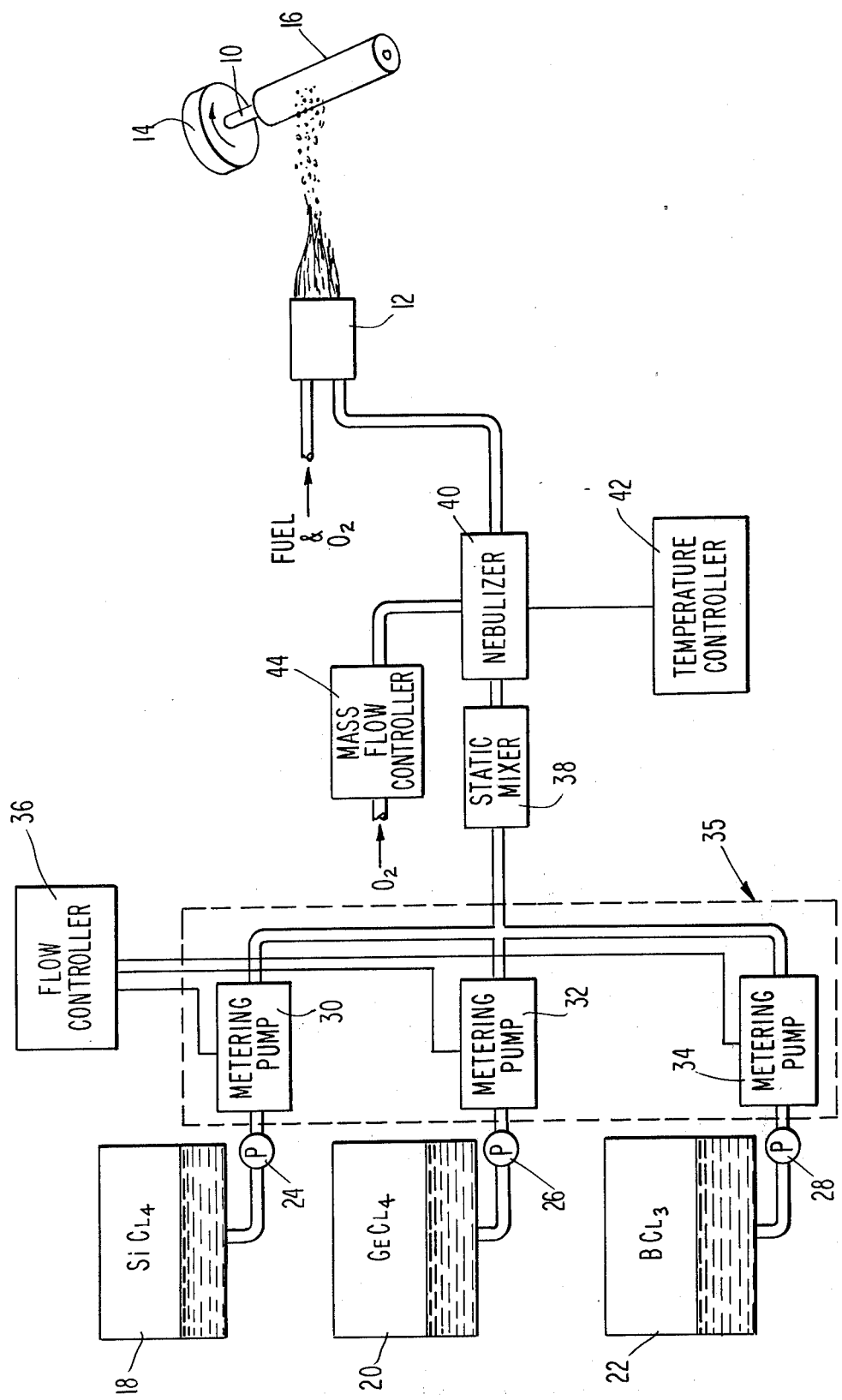

SYSTEM FOR DELIVERING MATERIALS TO DEPOSITION SITE ON OPTICAL WAVEGUIDE BLANK

BACKGROUND OF THE INVENTION

The present invention relates to optical waveguides, and more particularly to an improved system for delivering constituents of a waveguide blank to a deposition site.

It is now well known that light, whether modulated or unmodulated, can be caused to propagate within an elongate transparent body (such as a strand of glass or the like) in discrete modes if certain preconditions are met. The size of the strand, the radial gradation in refractive index, and other considerations combine to determine the effectiveness of the strand as a transmitting medium for optical communications. In order to transmit the light without an excessive "spread" among propagation modes, or to allow only predetermined modes of light to propagate, the internal characteristics of the strand must be closely controlled.

It is also well known that a strand appropriate for use as an optical waveguide can be formed by heating a cylindrical blank of a transparent dielectric material, such as glass, and drawing the blank into the desired thin, elongate structure. As is now well known to those skilled in the art, the structural characteristics of the waveguide closely emulate that of the blank from which it is drawn, particularly the gradient of the refractive index.

More particularly, according to one popular practice a drawing blank is formed by coating a rotating, cylindrical starting member with successive layers of a sinterable glass soot. The soot is built up, layer by layer, from minute siliceous particles which are applied to the surface of the blank through the mechanism of an oxidizing reaction flame or the like. As will be recognized by those skilled in the art, the flame used for sintering and transferring particles to the surface of a glass blank or the like has in the past been termed a "hydrolyzing flame". Although the precise phenomena involved are not yet fully understood, recent studies suggest that the actual reaction is more properly characterized as oxidation. Accordingly, the description of this reaction with respect to a presently preferred embodiment will use the term "oxidizing", it being recognized that the precise nature of the chemical reaction involved is not a material factor in practicing the present invention. A siliceous matrix material, such as silicon tetrachloride, is supplied in the form of a vapor to a burner from which the flame issues. Other materials, herein termed dopants, are also supplied in controlled amounts and at particular times to vary the optical characteristics of the end product.

The various vaporized or nebulized materials then combine with oxygen in the burner flame to form tiny spherical particles, which are maintained in the molten state and propelled toward the surface of the blank by the force of the flame. In this manner the deposited material, commonly termed "soot", is laid down along a spiral locus, layer by layer, the various layers merging together to form a continuum.

One process of the type described is disclosed in U.S. Pat. No. 2,272,342-Hyde and 2,326,059-Nordberg. In order to effect a radial variation in the index of refraction of the blank material, thereby to provide a concentric "cladding" member lying outwardly of a center (core) portion, the composition of the soot is changed at a predetermined time. The dopants may be increased, discontinued, or otherwise changed so that the radially outer portion or cladding of the blank exhibits a lower index of refraction than the inner portion thereof. The interface between the differing compositions then serves to define the boundary of a waveguide core within which optical signals may propagate. Explanation of this phenomenon and other pertinent information may be found in "Fiber Optics Principles and Applications" by N. S. Kapany, Academic Press (1967).

In order to deliver the siliceous matrix material and dopants to the region of an oxidizing reaction flame the materials are prepared in liquid form, then vaporized and conventionally transported to the region of the flame by carrier gas such as oxygen. One example of prior art apparatus for carrying out this procedure is disclosed in U.S. Pat. No. 3,826,560-Schultz. The constituents from which the blank is to be formed, such as silicon and a dopant such as germanium, are provided in the form of a liquid, ordinarily silicon tetrachloride and germanium tetrachloride. The liquid materials are confined in closed reservoirs and a carrier gas such as oxygen is introduced into the reservoirs beneath the level of the liquid. The carrier gas then bubbles upwardly through each liquid, entrainting vapors of the liquid and the resultant vapor is drawn from the reservoir and transported to the site of the oxidizing reaction flame. The silicon and the dopant there combine with free oxygen in the flame to form silicon oxide and dopant oxides, which materials are deposited upon a waveguide blank or other substrate.

While the foregoing system ordinarily performs adequately and is relatively straightforward in its basics, in fact highly accurate control mechanisms are required to achieve satisfactory operation. For prior art systems of the type described several highly accurate control loops must be provided to assure the proper flow of each component material. In particular, the mass rates of flow of the carrier gas through the liquids must be constantly monitored and closely coordinated, and moreover the relative delivery rates of the matrix material and the dopant materials must be closely related. This in turn requires close control of liquid temperatures, levels and pressures. Finally, in some cases difficulty has been encountered in providing sufficiently dense vapors to the region of the oxidizing reaction burner.

From the foregoing, it should now be understood that it would be highly desirable to provide a system for delivering waveguide materials to a reaction burner or the like which obviates the above disadvantages, and provides a controllable flow of highly densified vapors of the desired materials.

It is therefore an object of the present invention to provide improved apparatus for delivering waveguide constituents to a reaction burner or the like.

It is another object of the invention to furnish a system for delivering waveguide materials which requires a less intricate control system than prior art approaches.

A further object of the invention is to provide a system for delivering waveguide constituents from their respective reservoirs without the need for a carrier gas.

Still another object is to furnish simplified apparatus for metering waveguide component materials.

SUMMARY OF THE INVENTION

Briefly stated, in accordance with one aspect of the invention, the foregoing objects are achieved by providing various reaction product constituents which are maintained in liquid form in reservoirs and a metering pump coupled to each reservoir for delivering a predetermined volume of the liquid constituent to a mixing stage. The various liquids are thoroughly mixed, then nebulized. In a preferred embodiment a carrier gas, such as oxygen, is introduced into the stream of the nebulized, intermixed materials, and the material vapors transported to discharge means such as a reaction burner or the like. The source material vapors are then reacted in the flame in a conventional manner, and deposited upon a substrate to form a product such as an optical waveguide blank.

In a preferred embodiment of the invention the flow of carrier gas is controlled by a mass flow controller, and vaporization of the intermixed liquids is encouraged by heating the nebulizing stage and automatically controlling the temperature thereof. Further, a flow controller may be used for selectively varying the outputs of the various metering pumps so as to vary the composition of the reaction product being deposited upon the substrate in a predetermined manner.

BRIEF DESCRIPTION OF THE DRAWING

While the specification concludes with claims particularly pointing out and distinctly claiming the subject matter which is regarded as the invention, it is believed that the invention will be better understood from the following description of a preferred embodiment taken in conjunction with the accompanying drawing which constitutes a schematic illustration thereof.

DESCRIPTION OF A PREFERRED EMBODIMENT

Referring to the FIGURE, a layer of glass soot is applied to a substantially cylindrical starting member 10 by discharge means such as a flame hydrolysis burner 12. The starting member is rotated by means of a motor-driven chuck or the like 14, and the starting member translated before the burner so as to build up a generally cylindrical blank 16. For purposes of explanation, the present illustration is described in connection with the formation of a blank susceptible of being drawn into an optical waveguide, although the invention is not necessarily limited to such applications. Further, techniques other than flame reaction may be chosen for depositing the desired reaction products. As is familiar to those skilled in the art, the substrate or starting member 10 can subsequently be removed by mechanical or chemical processes so as to leave only the deposited material. The cylindrical blank is subsequently drawn into an elongate waveguide whose characteristics reflect the composition of the reaction product constituents.

The constituents which are ultimately incorporated in the reaction products are maintained in reservoirs 18, 20 and 22 which may be commercially-available pressurized tanks. The constituents are maintained in liquid form, for instance by maintaining them at temperatures and pressures between the solid and vapor phases of the materials. Thus, for example, silicon for forming the basic materials of the end product may be supplied in liquid form at ambient room temperature and pressure (e.g. 20° C. and one atmosphere) in the form of silicon tetrachloride. Other materials, to be added to the siliceous matrix to vary the index of refraction of the glassy end product, are confined in the other reservoirs or tanks. Thus, for example, germanium in the form of germanium tetrachloride is disposed in reservoir 20, while boron is provided by boron trichloride in reservoir 22. Appropriate valves 24, 26 and 28 are associated with the respective tanks for exercising some control over fluid flow if desired, and allowing the flow of various fluids to be completely cut off as, for example, for system maintenance or tank replacement. Metering pumps 30, 32 and 34 are provided, a separate metering pump for each constituent. The metering pumps may be selected from any appropriate one of the various commercially-available devices of this type, it being understood that "metering pumps" denotes those pumping devices which are adapted to deliver controlled quantities of a liquid. Such devices commonly include a control loop which maintains the pump output at a fixed volume in the face of variations in other process parameters such as input or output pressures. One example of such a device is the Model 100 HPLC solvent metering system available from Altex Scientific, Inc. of Berkeley, Calif. While the latter metering pumps are ordinarily intended for application in liquid chromatography systems, it has been found that their precise fluid delivery characteristics are of critical importance in the operation of the present invention.

A flow controller 36 may be provided, if desired, in order to change the output rate of each metering pump individually. With closed-loop metering pumps this control can be effected by changing a setpoint value in the control loop, which in turn changes the flow rate which is to be maintained by the metering pump. In a presently preferred embodiment a Model 420 microprocessor-programmer, manufactured by Altex Scientific, Inc., may be used. Alternatively a wide variety of devices may be adapted for supplying the requisite signals and it is anticipated that one or more rheostats, potentiometers, or active circuits may serve in lieu of a commercially-produced flow controller unit.

The outputs of the various metering pumps are combined at, or upstream from, a mixing stage 38 which in a preferred embodiment is a static mixer. As is well known by those skilled in the art, static mixers are generally constituted by a conduit having appropriate internal baffles for repeatedly dividing and rotating a stream of fluid introduced into the device. This procedure thoroughly intermixes the various liquids flowing through the device so that a relatively homogeneous mixture results. A presently preferred mixer is manufactured by Komax Systems, Inc. of Carson, Calif. and designated part No. 250-021.

The intermixed liquids are then nebulized or vaporized by appropriate apparatus, schematically illustrated as a separate nebulizer 40. While in a preferred embodiment a separate nebulizing or vaporizing stage is provided, it should be understood that it is also possible to cause the intermixed liquids to vaporize by applying the requisite amount of heat to the static mixer, so that the liquids are intermixed and vaporized in a single operation. The actual site of vaporization is not critical to the present invention; and it will be recognized that a combined nebulizer/mixer stage is fully equivalent to separable mixing and nebulizing means. In the illustrated system, wherein the nebulizer 40 is shown as a separate element, the vaporization of the intermixed liquids can be accomplished by forcing them through a small orifice or nozzle and/or heating the liquids to or above their boiling temperature, as in a nebulizing tee. The temperature of the nebulizing area is maintained at an appropriate level by means of a temperature controller 42 or the like. A heater controller which has been found to be well adapted for use with the present invention is the Model 2155 Proportional Electronics Temperature Controller marketed by the Cole Panner Instrument Company of Chicago, Ill. While such controllers are commercially available and easily adapted for use in the instant system, it should be recognized that the schematically illustrated controller may alternatively be constituted by familiar elements such as rheostats, potentiometers, etc. coupled in combination with a thermostat or the like.

In the illustrated embodiment a carrier gas such as oxygen is introduced into the stream of fluid flow, preferably at or subsequent to the point of vaporization. The rate of introduction of the carrier gas is controlled by mass flow controller 44. As is well known by those skilled in the art such controllers are conventionally found in fluid flow systems, and various appropriate types of controllers are readily commercially available. One example of such a controller is the Tylon model FC-260, available from the Tylon Corp. of Torrance, Calif. The flow rate of the oxygen is preferably controlled as a function of the flow rate of the liquid constituents so that an appropriate amount of oxygen is introduced into the system. While it is deemed preferable to inject some amount of carrier gas into the system, this step is not necessary and in fact one of the advantages of the present system is that a much more dense flow of reaction product constituents can be achieved inasmuch as the carrier gas is not relied upon as the sole means of transporting the reaction product as in the prior art.

As the nebulized silicon and dopant constituents reach reaction burner 12 they become mixed with an appropriate fuel, such as natural gas, and oxygen. The comingled vapors, oxygen and fuel, then issue from the burner and are ignited. In the ensuing reaction the silicon matrix material, and the dopant materials, are oxidized and are directed toward blank 16 in the form of microscopic fused particles. The chlorine or other material with which the matrix and dopant materials had previously been combined is separated from the materials, and combines with hydrogen from the hydrocarbon fuel to form hydrochloric acid. The specific nature of the reaction depends, of course, upon the constituents present and the specific application of the invention. Such reactions themselves form no part of the present invention, and it is anticipated that other constituents may be used without departing from the thesis of the invention. In addition, still other forms of deposition apparatus such as IVPO (Inside Vapor Phase Oxidation) systems, or other mechanisms which transfer the matrix and dopant materials to a substrate, may be selected for use with the invention. In the present illustration, it will be recognized that in the absence of oxygen as a carrier gas additional oxygen above and beyond the stoichiometric amount required for combustion of the fuel must be delivered to the burner 12.

To operate the illustrated system, flow controller 36 is adjusted or programmed to provide appropriate setpoints for the various metering pumps so that the latter transfer volumes of $SiCl_4$, $GeCl_4$ and $BCl_3$ at flow rates which result in the desired apportionment of silicon, germanium, and boron. Of course, other materials may be selected for effecting the index of refraction of the glass to be formed; materials such as aluminum, antimony, lanthanum, lead, nobium, phosphorous, tantalum, tin, titanium, zinc and zirconium may be used alone or in combination. For proper implementation of the invention it is necessary that these materials be supplied in liquid form, or more precisely in the form of liquified compounds. Once valves 24, 26 and 28 are opened, the associated pumps meter properly apportioned flows of the materials to a static mixer 38 wherein they are thoroughly mixed.

In order to maintain the various materials in liquid form preparatory to their mixing it may in some instances be desirable to maintain them at below ambient temperatures, and accordingly a refrigerated enclosure 35 or the like may be provided to prevent premature vaporization. In similar fashion, materials having high melting points may be heated above room temperature to form a liquid. Once they have been mixed, however, they may be vaporized within the static mixer by the addition of heat, or by the use of a separate nebulizer apparatus. A properly-metered flow of oxygen is then introduced into the nebulized, combined vapors and together they are urged to burner 12, wherein they are combined with oxygen in the flame issuing from the burner and ultimately deposited upon the surface of blank 16. The blank, when completed, is porous in form and must be heated to fuse or "collapse" it into a monolithic glassy blank which can be drawn into an optical waveguide in the conventional manner.

In order to radially vary the index of refraction of the waveguide structure, the proportions of the various constituents may be changed at a predetermined point during the formation of the blank. Accordingly, flow control 36 is caused to produce a command signal for various ones of the metering pumps at a predetermined time, or after blank 16 has attained some predetermined size, so that the amount or kind of dopants are changed. Ordinarily the change is such as to effect a decrease in the refractive index of the ultimate glass product. Accordingly, metering pump 32 or 34 may increase its output somewhat in order to increase the relative flow rates of the $GeCl_4$ or $BCl_4$ to static mixer 38 with the result that subsequent layers of blank 16 contain a commensurately higher percentage of a selected dopant and accordingly exhibit a higher or lower index of refraction.

From the foregoing description, it will be evident that certain aspects of the invention are not limited to the particular details of the examples illustrated and it is therefore contemplated that other modifications or applications will occur to those skilled in the art. It may, for instance, be unnecessary to provide higher or lower than ambient temperatures at the metering pumps for certain constituents. Further, the flow controller 36 may be implemented by a computer or other data processing apparatus. Such modifications, however, are considered to be straightforward modifications of the instant system and well within the scope of the invention. It is accordingly intended that the appended claims shall cover all such modifications and applications as do not depart from the true spirit and scope of the invention.

What is claimed as new and desired to be secured by Letters Patent of the United States is:

1. In a system including discharge means for depositing a fused siliceous reaction product upon a substrate, the improvement comprising:

first and second reservoirs each for containing a liquid comprising a desired reaction product constituent;

metering pump means coupled to each of said reservoirs for delivering each of the liquids at a controlled flow rate;

mixing means for substantially intermixing liquids received from said metering pump means;

nebulizing means associated with said mixing means for converting the liquids to finely divided form; and conduit means for conducting the finely divided liquids to the discharge means.

2. A system according to claim 1, further including means for introducing a carrier gas into the flow of the liquids downstream of said metering pump means.

3. A system according to claim 2, further including means for maintaining said liquids below their boiling temperatures precedent to the introduction of said liquids into said mixing means.

4. A system according to claim 3, further including means for raising the temperature of said nebulizing means to facilitate vaporization of the liquids.

5. A vapor deposition system for forming an optical waveguide blank, comprising:

vapor deposition means for receiving source material vapor entrained in a carrier gas and directing said vapor toward a starting member;

a plurality of reservoirs for containing liquids comprising source materials;

a plurality of metering pump means, each of said pump means being coupled to one of said reservoirs for delivering controlled quantities of at least some of the liquids;

a mixing stage coupled in fluid receiving relationship to said metering pump means for intermixing the delivered liquids;

means operatively associated with said mixing stage for nebulizing the liquids; and means for delivering the nebulized liquids to said vapor deposition means.

6. A vapor deposition system according to claim 5, further including means for introducing a carrier gas into the path of said liquids for assisting in the delivery of nebulized liquids to said vapor deposition means.

7. A vapor deposition system according to claim 6, further including heating means disposed in heat transfer relationship with said nebulizing means for encouraging vaporization of the liquids.

8. A vapor deposition system according to claim 7, wherein said mixing stage comprises a static mixer.

9. A vapor deposition system according to claim 6, wherein at least one of the liquids in said reservoirs comprises silicon, and at least one of the other liquids in said reservoirs comprises a dopant for affecting the refractive index of a siliceous optical waveguide blank.

10. A vapor deposition system according to claim 9, further including mass flow control means for regulating the flow of said carrier gas into said system.

11. A vapor deposition system according to claim 10, wherein said vapor deposition means comprises a reaction burner, and further including means for supplying a combustible gas to said burner.

12. A vapor deposition system according to claim 11, further including temperature control means operatively associated with said nebulizing means for controlling the amount of heat added to the liquids.

13. A vapor deposition system according to claim 5, further including means for automatically controlling the volumes of liquids delivered by said metering pumps to thereby determine the proportions of source materials delivered to said vapor deposition means.

* * * * *